United States Patent [19]

Wolfe et al.

[11] Patent Number: 5,728,261
[45] Date of Patent: Mar. 17, 1998

[54] MAGNETICALLY ENHANCED RADIO FREQUENCY REACTIVE ION ETCHING METHOD AND APPARATUS

[75] Inventors: John C. Wolfe, Houston, Tex.; Sandeep V. Pendharkar, Tempe, Ariz.

[73] Assignee: University of Houston, Houston, Tex.

[21] Appl. No.: 451,320

[22] Filed: May 26, 1995

[51] Int. Cl.$^6$ .......................... H01L 21/302; H01L 21/30
[52] U.S. Cl. ...................... 156/662.1; 156/643.1; 156/646.1
[58] Field of Search ............... 156/643.1, 646.1, 156/662.1, 345; 216/71, 70

[56] References Cited

U.S. PATENT DOCUMENTS

| | | | |
|---|---|---|---|
| 4,624,767 | 11/1986 | Obinata | 156/345 |
| 4,661,203 | 4/1987 | Smith et al. | 156/643 |
| 4,943,344 | 7/1990 | Tachi et al. | 156/643 |
| 4,983,253 | 1/1991 | Wolfe et al. | 156/643 |
| 5,118,383 | 6/1992 | Engelhardt | 156/643 |
| 5,160,398 | 11/1992 | Yanigada et al. | 156/345 |
| 5,162,633 | 11/1992 | Sonobe et al. | 219/121.43 |
| 5,228,940 | 7/1993 | Yoneda | 156/643 |
| 5,292,401 | 3/1994 | Yoneda | 156/643 |
| 5,304,279 | 4/1994 | Coultas et al. | 156/345 |
| 5,366,586 | 11/1994 | Samukawa | 156/643 |
| 5,423,945 | 6/1995 | Marks et al. | 156/643 |

FOREIGN PATENT DOCUMENTS

| | | |
|---|---|---|
| 425166 | 5/1991 | European Pat. Off. |
| 03046325 | 2/1991 | Japan. |
| 05347280 | 12/1993 | Japan. |

OTHER PUBLICATIONS

"Cryogenic Dry Etching For High Aspect Ratio Microstructures",-pp. 65-70,-7-1993'; Proceeding-IEEE-Micro Electro Mechanical Systems; IEEE cat. No. 93CH3265-6; Murakami et al.

"Tungsten trench etching in a magnetically enhanced triode reactor", S. V. Pehnharkar and J. C Wolfe, J. Vac. Sci. Tecnol B12(2) pp. 601-4 (1994).

*Primary Examiner*—R. Bruce Breneman
*Assistant Examiner*—George Gouddreau
*Attorney, Agent, or Firm*—R. Russel Austin

[57] ABSTRACT

An RF diode reactive ion etching (RIE) method and apparatus (20) include an evacuable reaction chamber (22) in which an anode electrode (76) and cathode electrode (30) are spaced-apart facing each other and defining a gap (78) between the electrodes. A substrate (40) to be etched is placed in thermal contact with the cathode. A magnet (70) behind the anode provides a magnetic field which is characterized by lines-of-force (80) extending continuously through the gap from one of the electrodes to the other. To etch the substrate the reaction chamber is evacuated, an etchant-gas is admitted into the gap at a predetermined low pressure, a plasma (79) including ions of the etchant gas is generated by applying RF power to the electrodes. The substrate is etched by etchant gas ions attracted from the plasma toward the substrate by a negative self-bias potential established on the cathode.

1 Claim, 6 Drawing Sheets

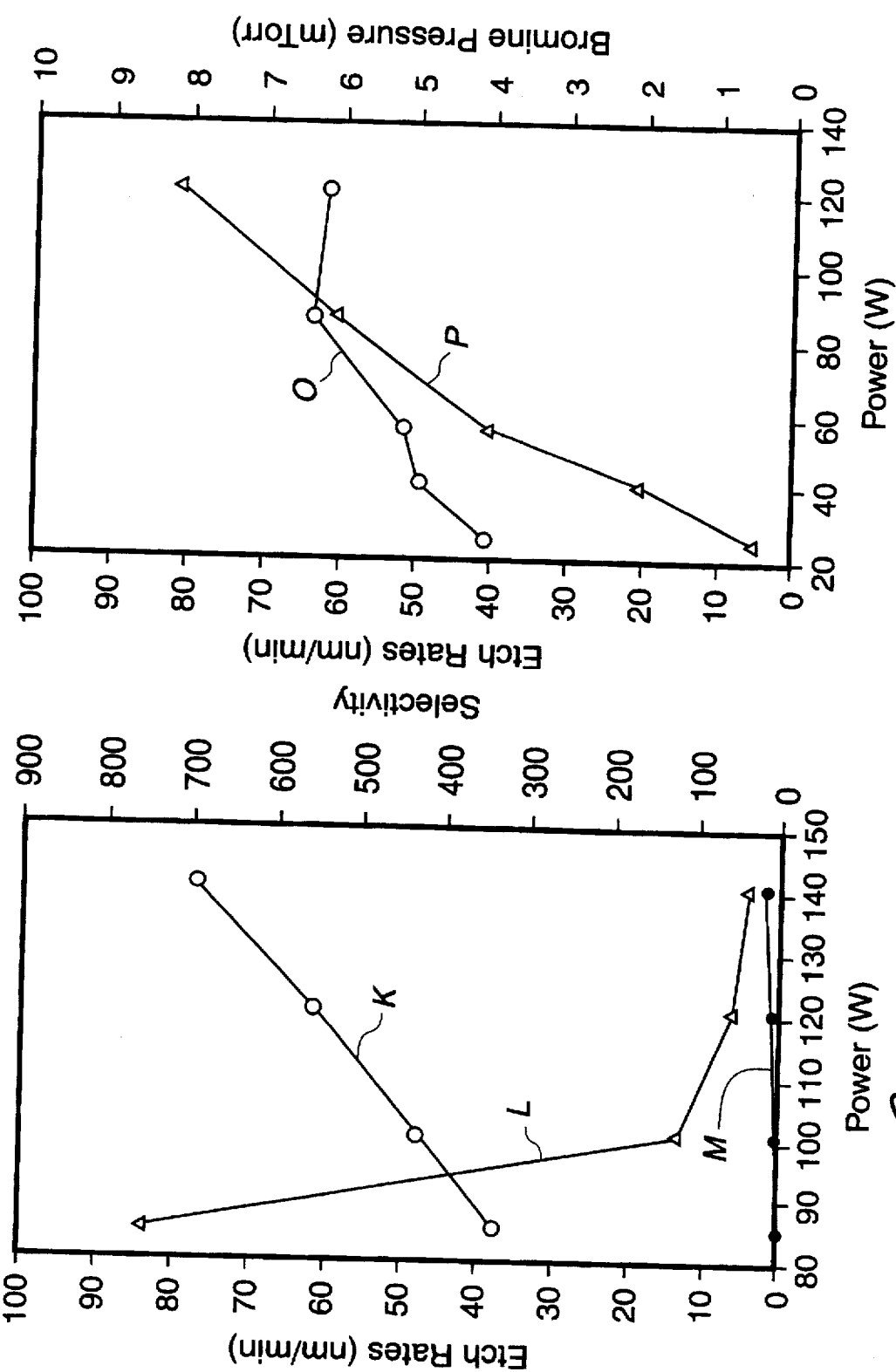

MAGNETICALLY ENHANCED RADIO FREQUENCY REACTIVE ION ETCHING METHOD AND APPARATUS

TECHNICAL FIELD OF THE INVENTION

The present invention relates in general to magnetically-enhanced reactive ion etching methods (RIE), employing a radio frequency (RF) plasma to provide etching ions. It is directed in particular to a magnetically-enhanced, RF plasma, RIE method wherein an electric field and a magnetic field have field lines substantially aligned with each other.

DISCUSSION OF BACKGROUND ART

Reactive ion etching methods (often collectively termed dry-processing methods) have become increasingly employed to replace wet chemical etching methods in semiconductor device fabrication. In a reactive ion etching method, an etchant is provided in the form of a gas. In a reaction chamber, the etchant-gas is formed, by electrical excitation, into an electrically-conductive gas plasma wherein some proportion of the etchant-gas is in the form of etchant-gas ions. The etchant-gas ions are attracted toward a material to be etched, generally by placing the material in the vicinity of an electrode held at a negative electrical potential. The ions react with the material to be etched forming a gaseous compound of the material and the etchant-gas, thereby eroding or etching the material.

Generally, the greater the proportion of the etchant-gas which is converted into ions, the faster the etching process will be. An efficient ion forming method may allow a lower etchant-gas pressure to be employed. Lower etchant-gas pressures generally allow greater ion energy and directionality, all of which may be important in the etching process.

Ion forming efficiency is usually increased (magnetically-enhanced) by causing a magnetic field to interact with an electric field which excites etchant-gas to generate or form the plasma. Many apparatus arrangements have been developed for carrying out magnetically-enhanced RIE operations. For purposes of understanding the present invention, such apparatus may be classified in two categories.

A first of these categories comprises so-called RF diode apparatus wherein RF power is applied between an anode and a cathode to provide a plasma in the vicinity of the cathode. Material to be etched is located on or close to the cathode. Negative potential may be established on the cathode by a self-bias mechanism or by applying a separate bias potential thereto. The present invention falls into this category.

A second of these categories comprises apparatus wherein plasma-generating power is provided by an electrical system separate from an electrical system for directing or steering ions in the plasma toward material to be etched. For purposes of this description such systems will be termed hybrid systems.

Typically, in such hybrid systems, material to be etched is placed on an etch platform (separate from any plasma-generating electrodes) which is held at a negative potential. Included in this category is apparatus in which plasma-generating power is provided at a microwave frequency, for example so-called electron-cyclotron resonance (ECR) apparatus. Apparatus in this second category is typically more physically and electrically complex, and hence more costly to fabricate and maintain than apparatus in the first category. Nevertheless, as use of such apparatus for dry-processing operations is not uncommon, it must be believed that for whatever operations the apparatus is used, the expense and complexity thereof is justified by a useful result.

One semi-conductor device fabrication operation of particular interest is etching trenches in, or slots through, a layer of material, the trenches or slots having a high aspect ratio, i.e, a width significantly narrower than the thickness of the layer. This operation becomes increasingly demanding the narrower the slots are required to be.

One example of such an operation is etching slots through a layer or membrane of silicon (Si) to form the membrane into a stencil mask for other ion beam patterning operations. The slots in the membrane are defined by another mask, typically deposited on the membrane by a vacuum deposition process of some kind. A preferred mask material for etching Si membranes is silicon dioxide ($SiO_2$).

In such a Si membrane etching operation, it is typically required to provide slots having a width less than 0.1 micrometers ($\mu m$) in a membrane having a thickness of about 1.0 $\mu m$. An important requirement for the slots is that walls of the slots must be vertical, i.e., (perpendicular to a surface of the membrane) such that slot width does not taper in a direction perpendicular to the membrane. Tapered slot walls can reduce effectiveness of a mask, and eventually determine how many slots of a given width can be etched into a given area of a membrane of a given thickness.

There are several interdependent etching device and etching process parameters which determine how slot walls are formed. These parameters include etchant-gas species, etchant-gas pressure, ion accelerating potential, plasma power, electrode configuration, relative orientation of electric fields and magnetic fields, and etching rate. Generally, it is considered particularly important that etchant-gas ions are directed towards a surface to be etched in a collimated beam.

The mask through which the membrane etching is performed can also influence the formation of slot walls. Any set of process and device parameters must provide an etching process which etches the membrane material selectively, i.e., in preference to the mask material, such that the mask is not degraded during the etching process. Some indication of the degree to which etching device and process parameters and results obtained therewith are interdependent is provided in brief discussion set forth below.

In general, an effective operating pressure range for an RIE process and apparatus has an upper bound determined by scattering of ions in the etching plasma, which in turn degrades collimation of the ions. Micro-loading, or aspect ratio-dependent etching may also be a consequence of ion scattering. It is generally believed that etching must take place at a pressure of about 3 milliTorr (mTorr) or less to avoid problems due to ion scattering. A lower bound may be a value below which a plasma can not be generated or at a higher value, wherein poor selectivity or unacceptable etching rate are determining factors. In a paper by Bestwick and Oehrling. "Reactive ion etching of silicon using bromine containing plasmas", JVST A8 1696 (1990), it is taught that it is necessary, in a conventional diode apparatus, to reduce power to maintain etch selectivity between Si and $SiO_2$. This provides for unacceptably low etch rates at pressures below 10 mTorr. As noted above however, it is believed that a plasma pressure less than 3.0 mTorr is necessary to avoid unacceptable ion scattering.

In U.S. Pat. No. 4,983,253, (Wolfe et al), which is assigned to the assignee of the present invention, and the complete disclosure of which is hereby incorporated by reference, a magnetron-enhanced, RF diode RIE apparatus is described which may be operated at a pressure of about 2.0 mTorr. This patent teaches that, using a bromine (Br) plasma, trenches or slots having a wall taper of about 4 degrees may be etched in silicon. A 4 degree wall taper, however, provides for a minimum slot width of only about 0.18 μm.

ECR apparatus may be operated at pressures less than 1.0 mTorr. Such apparatus, however, is not without disadvantages. For example, in a paper by Fujiwara et al. *"ECR plasma etching with heavy halogen ions", J. Electrochem. Soc* 29, 2223 (1990), it is taught that ion collimation in ECR plasmas is not exceptional, primarily due to high ion-temperature (energy) inherent in such plasmas. It is taught that adverse consequences of the non-exceptional collimation can be offset by a high (negative) potential applied to the etch platform. The increased voltage, however, reduces selectivity, which requires that plasma pressure be increased to restore selectivity. Increasing pressure, in turn, reduces etch rate. Results disclosed in the Fujiwara et al. paper indicate slots in Si having a wall taper of 2 degrees (from vertical) could be produced at an etch rate of 25 nanometers per minute (nm/min). While clearly better than the 4 degree taper of Wolfe et al, a two degree taper may be considered unacceptably large for a high-quality Si stencil mask. A 25 nm/min etch rate may be considered unacceptably slow.

In a paper by Sung and Pang, *"Etching of Si with Cl2 using an electron cyclotron resonance source", JVST A*11, 1206, (1993), etch features as narrow as 0.15 μm having an aspect ratio of 7:1 are described. The features have a non-linear wall profile which may be described as a "waisted" profile in that a slot initially becomes narrower then at greater depth, becomes wider. The results described in the Sung and Pang paper are believed to be representative of the best Si etching results obtained, using ECR apparatus, as of the date of preparing the instant specification.

It is believed that there is a continued need for an improved RIE method for etching narrow, high aspect-ratio slots, at high rates in materials such a Si. Clearly any improved method will be more acceptable the simpler and less costly the apparatus required for carrying out that method.

SUMMARY OF THE INVENTION

The present invention is directed to a method and apparatus for etching a narrow, high aspect-ratio feature or slot in relatively thick layer of material.

In a general aspect, the method of the present invention comprises providing an anode electrode and a cathode electrode, the electrodes being arranged facing each other, spaced apart and defining a gap therebetween. A layer of material to be etched is located in the gap proximate the cathode electrode, with a selected surface of the layer of material facing the anode electrode.

A magnetic field is provided in the gap. The magnetic field is characterized by magnetic lines-of-force extending continuously through the gap, from the anode electrode to the selected surface of the layer of material at all points on the selected surface.

An etchant-gas is admitted into the gap and RF electrical power is applied between the anode and cathode electrodes, thereby generating an etchant-gas plasma in the gap. The layer is etched by means of etchant-gas ions attracted from the plasma toward the cathode electrode.

Preferably the layer of material to be etched is cooled while etching is taking place. This may be achieved by cooling the cathode electrode, and placing the layer of material to be etched in thermal contact with the cathode electrode.

One particular embodiment of the present invention, is directed to forming a silicon stencil mask by etching a layer or membrane of silicon. This particular embodiment, the method comprises providing an anode electrode and a cathode electrode. The electrodes are disc-shaped and are arranged, facing each other, on a common axis extending therethrough, and are spaced apart defining a gap therebetween. A silicon membrane to be etched is located in the gap, in thermal contact with the cathode, with a selected surface of the membrane facing the anode electrode.

A magnetic field is provided in the gap. The magnetic field is provided by a disc-shaped magnetic body polarized on opposite faces thereof. The disc-shaped magnetic body has a diameter greater than the diameter of the membrane. The magnetic field is characterized by magnetic lines-of-force extending continuously through the gap, from the anode electrode to the selected surface of the membrane at all points on the selected surface of the membrane.

Pure bromine-gas is admitted into the gap, and RF electrical power is applied between the anode and cathode electrodes thereby generating a bromine-plasma in the gap. While cooling the cathode electrode, the membrane is etched by bromine ions attracted from the bromine-plasma toward the cathode electrode.

The above-summarized silicon membrane etching method has been employed to etch 0.04 μm wide slots through a 0.75 thick silicon membrane mask. Slots thus etched had a wall slope (taper) less than 0.2 degrees. Such a taper corresponds to a width difference between opposite ends of a slot (on opposite side of the mask) of less than ten silicon atom diameters for a 1.0 μm thick mask.

Apparatus specifically configured for carrying out the above-summarized methods may be described as magnetically-enhanced asymmetric diode RF apparatus. From a detailed description presented hereinafter, it will be evident to those skilled in the art relevant to the present invention, that such apparatus is relatively simple and inexpensive to construct and operate, compared with above-discussed hybrid apparatus, particularly ECR apparatus.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 9 is a graph schematically illustrating etch rates for silicon and silicon dioxide, and $Si/SiO_2$ selectivity as a function of RF power in an eight milliTorr bromine-plasma in the apparatus of FIG. 1.

FIG. 10 is a graph schematically illustrating etch rate of silicon and bromine-plasma pressure as a function of RF power for constant (about 50:1) $Si/SiO_2$ selectivity in the apparatus of FIG. 1.

DETAILED DESCRIPTION OF THE INVENTION

Figure 1:
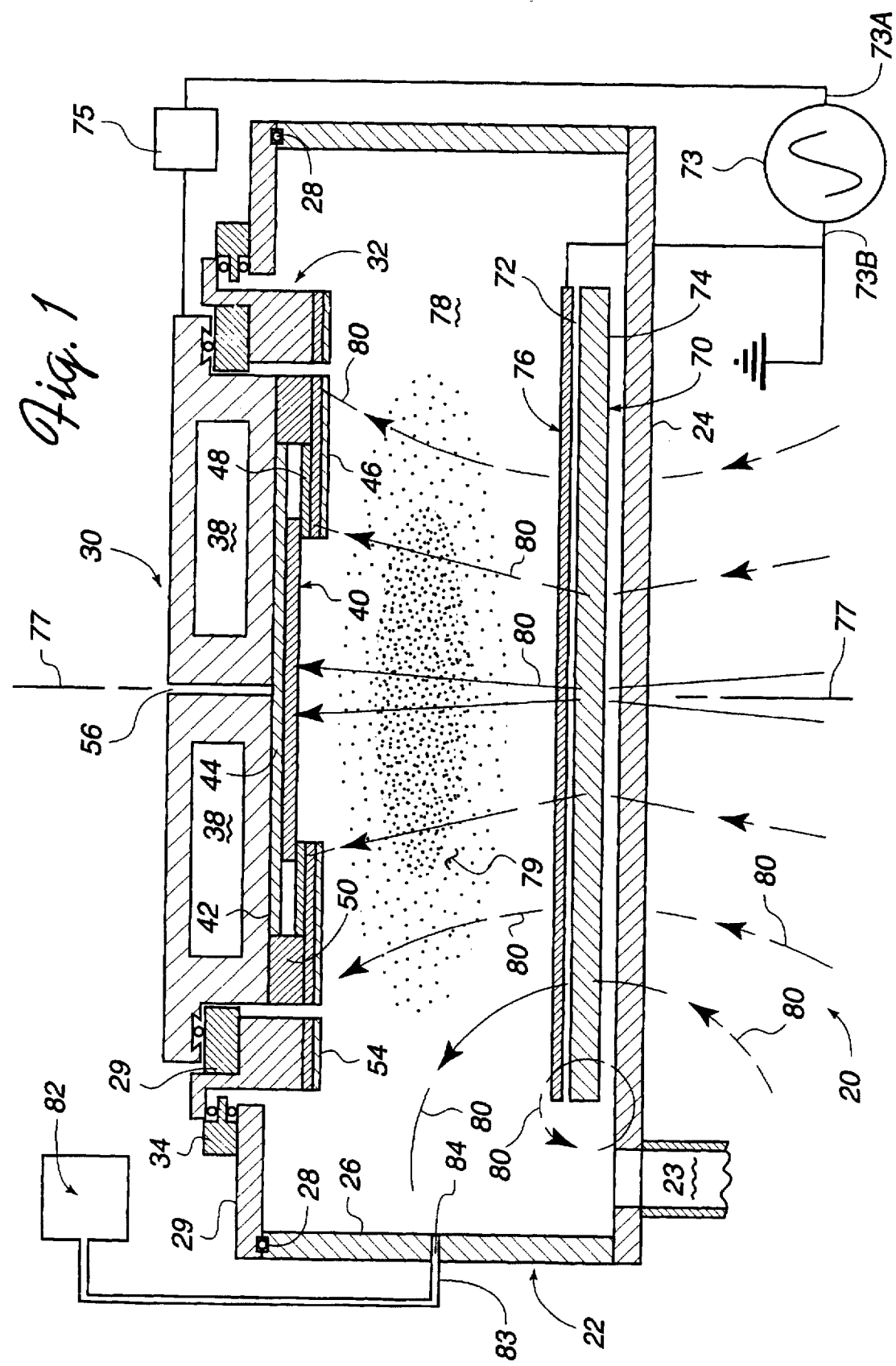
FIG. 1 is a general cross-section view schematically illustrating one preferred embodiment of apparatus for carrying out reactive ion etching in accordance with the present invention.

Turning now to the drawings, FIG. 1 schematically illustrates one a preferred embodiment 20 of apparatus specifically configured for carrying out the RIE method of the present invention. Apparatus 20 includes a stainless reaction chamber 22, preferably of stainless steel, which may be evacuated and in which a vacuum may be maintained. Chamber 22 has a base plate 24, walls 26 and a top plate 28.

Disposed in chamber 22, and electrically insulated therefrom by an insulator 29, is a generally disc-shaped or cylindrical electrode 30, which may be described as a cathode. A preferred metal for forming cathode 30 is stainless steel, however, aluminum may be used provided that precautions described hereinafter are taken to avoid corrosion by etchant gasses. An annular electrode 32 surrounds cathode 30, and is electrically insulated therefrom by insulator 29. Annular electrode 32 is located about co-planar with cathode 30. Annular electrode 32 is electrically insulated from chamber 22 by an insulator 34. Insulators 29 and 34 may be conveniently fabricated from borosilicate glass.

Electrode 32 is provided to allow apparatus 20 to be operated in a triode mode. It is noted here, however, that triode operation was not investigated in arriving at the etching method of the present invention. In all diode operations of apparatus 20, discussed hereinafter, potential of electrode 32 "floats" responsive to other operating parameters of the apparatus.

It is not clear to what extent, if any, electrode 32, electrically floating in this manner, positively influences results obtained with the method of the present invention. Given the results obtained however it seems unlikely that electrode 32 has a negative influence on the results. Electrode 32 is believed to contribute significantly to reducing arcing during operation of apparatus 20. This improves stability of the etching process.

Continuing now with a description of cathode 30, Cathode 30 is provided with cooling channels 38 through which a cooling fluid may be circulated for cooling cathode 30. In a preferred cooling method, freon is circulated through channels 34 and then through a water cooled heat exchanger (not shown). A substrate 40 to be etched is preferably mounted on an extended flat surface 42 of cathode 30 in a manner which allows the substrate to be cooled.

In a preferred mounting method, a borosilicate glass disc 44 having a thickness of about 0.8 millimeters (mm) is placed on surface 42, and substrate 40 is placed on disc 44. Borosilicate glass disc 44 prevents etching of surface 42 by etchant-gasses. Substrate 40 is clamped in position by a quartz-covered stainless steel clamping-ring 46 and a seal 48. Clamping-ring 46 is attached to a raised edge-portion 50 of cathode by screws 52 (not shown). Clamping-ring 46 not only provides a substrate clamping means, but also prevents raised edge-portion 50 of cathode 30 from corrosion by etchant-gasses. A quartz covered ring 54 similarly protects electrode 32 from corrosion.

Thermal contact between substrate 40 and cathode 30 is established by introducing helium-gas via an aperture 56 extending through cathode 30 and quartz disc 44 and between substrate 40 and quartz disc 44. Seal 48 prevents helium-gas from escaping into chamber 22.

Figure 2:
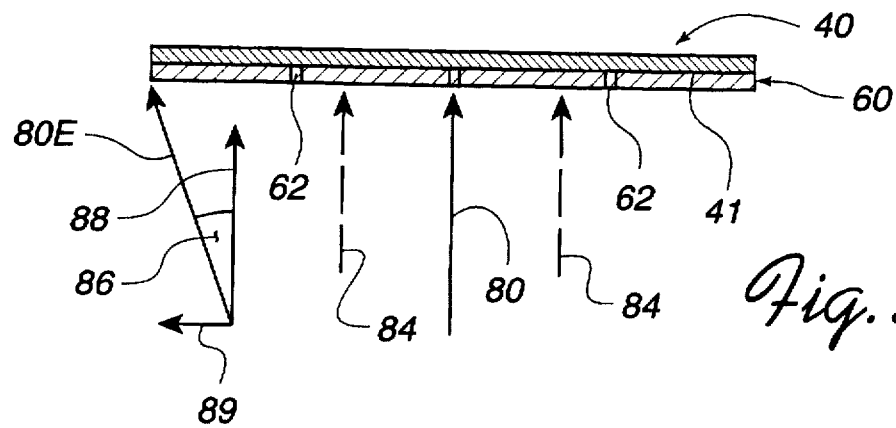
FIG. 2 is a general cross-section view schematically illustrating orientation of magnetic lines-of-force relative to a layer of material to be etched in the apparatus of FIG. 1.

It should be noted here that, in one situation, substrate 40 may be a substrate carrying a layer of material to be etched, which layer typically would be covered by a mask having apertures therein corresponding to a pattern to be etched. In another situation, substrate 40 may be a free-standing layer or membrane to be etched. This latter situation is depicted in FIG. 2 wherein a surface 41 of membrane (substrate) 40 is covered by a mask 60 including apertures 62 therein defining a pattern to be etched into the membrane.

The apparatus and method of the present invention are applicable in either of the above-described etching situations. Whatever the situation, however, cooling substrate 40 is considered an important aspect of the present invention. Cooling of substrate 40 when substrate 40 is a membrane to be etched is considered particularly important.

During etching, energy is deposited on substrate 40 by ions and exothermic etching reactions. Absent a cooling mechanism, temperature of substrate 40 could rise by as much as a few hundred degrees Celsius (°C.). Such a high substrate temperature could cause loss of etch selectivity, undesirable isotropic (as opposed to directional) etching, and reticulation of any photoresist mask on the substrate. In examples and experiments described in detail herein after, wherein substrate 40 is a silicon membrane having a thickness between about 0.75 mm and 2.5 mm, mounted and cooled as described above, the membrane temperature was maintained at about 25° C.

Continuing with reference to FIG. 1, located within chamber 22 is a disc shaped magnet 70 such as a ferrite magnet. Magnet 70 is oppositely polarized, on opposite faces 72 and 74 thereof. It is not important which of faces 72 and 74 is a north pole.

Magnet 70 may be conveniently placed directly on base plate 24. A disc-shaped ground plate or anode electrode 76 rests on magnet 70 facing electrode 30, thereby defining a gap 78 therebetween.

Magnet 70 may be conveniently described as being located "behind" anode 76 in as much as magnet 70 is outside gap 78 and shielded from any plasma therein by anode 76. It should be noted that base plate 24 of chamber could serve as an anode, instead of ground plate 76, with magnet 70 outside of chamber 22 and underneath baseplate 24. Those skilled in the relevant art however would recognize that this arrangement would not make optimum use of magnet 70.

Magnet 70, anode 76 and cathode 30 are preferably aligned on a common axis 77 extending therethrough. Anode 76 is preferably an aluminum disc having a thickness greater than about 2.0 mm and should have a diameter greater than or equal to the diameter of magnet 70 in order that the magnet is shielded from any plasma generated within gap 78.

A magnetic field created by magnet 70 may be characterized by lines-of-force 80 which exit one face of the magnet and return through the opposite face in loops of increasing diameter from the periphery of the magnet toward the center of the magnet. It is important in the present invention that magnetic lines-of-force extend continuously through gap 78 between anode 76 and substrate 40 at all points on cathode-facing surface 41 thereof. It is preferable that lines-of-force 80 also extend continuously through gap 78 between anode 76 and cathode 30 at all points on surface 42 (the anode-facing surface) thereof.

RF power is applied between cathode 30 and anode 76 from an RF power supply 73, preferably at a frequency of 13.65 Megahertz (MHz). Power supply 73 is electrically connected on side 73A thereof to cathode 30 via a matching network 75. Power supply is connected on side 73B thereof to anode 76, chamber 22, and to ground.

Chamber 22 is provided with a pump arrangement (not shown) for exhausting the chamber. In one preferred pumping arrangement an oil diffusion pump (not shown) exhausts chamber 22 via a port 23 therein. The oil diffusion pump is preferably backed by a two stage mechanical pump (not shown). Inert oils should be used for the mechanical and diffusion pumps.

A first liquid nitrogen cryogenic trap (not shown) is preferably located between chamber 22 and the diffusion pump for pumping of condensables. Preferably a second liquid nitrogen cryogenic trap (not shown) is located between the mechanical and diffusion pumps, and is constantly kept cold by an automatic liquid nitrogen level controller (not shown). This second cryogenic trap prevents etchant-gas from entering the mechanical pump, thus preventing corrosion of the pump by the etchant-gas. After a prolonged period of operation, for example between about one and two weeks, the second cryogenic trap is isolated from apparatus 20 and etchant-gasses accumulated therein are neutralized. Such a pumping arrangement preferably provides a base vacuum of about $5 \times 10^{-6}$ mTorr or less. As vacuum pump arrangements and methods of connecting such arrangements to a vacuum chamber are well known to those familiar with the art to which the present invention pertains, further details concerning pumping arrangements are not presented herein.

An etchant-gas plasma 79 is created in gap 78 by pumping out chamber 22, admitting an etchant-gas into chamber 22 from an etchant-gas delivery arrangement 82, via a conduit 83 and an inlet port 84; applying RF power between anode 76 and cathode 30; and thereby creating an electrical discharge (plasma) in the etchant-gas. Electrons created in the discharge are forced to take a spiral path along lines-of-force 80, resulting in increased electron path length. This longer path length is instrument in enhancing or intensifying plasma 79 by increasing electron-neutral collisions, thereby creating more etchant-gas ions in plasma 79.

While RF power is applied and plasma 79 is maintained, cathode 30 acquires a negative, self-bias potential as a result of electrons accumulating near the surface of the cathode. The negative potential attracts etchant-gas ions from plasma 79 toward cathode 30 and hence toward substrate 40. Substrate 40 is thus bombarded and etched by the attracted etchant-gas ions. This self-bias potential is an important operating parameter of apparatus 22, and is related to other operating parameters in a manner described hereinafter.

Apparatus 20 is preferable operated in a plasma-pressure range between about 2.0 and 15.0 mTorr, and more preferably between about 4.0 and 10.0 mTorr. RF power density on cathode 30 is preferably bewteen about 0.1 and 1.00 Watts per centimeter squared ($W/cm^2$).

Continuing now with reference to FIG. 2, as pointed out above, it is important in the present invention that magnetic lines-of-force extend continuously through gap 78 between anode 76 and substrate 40 at all points on cathode-facing surface 41 thereof. Additionally it is important that magnetic lines-of-force 80 are substantially parallel to electric field lines (indicated in FIG. 2 by broken lines 84) set up by cathode 30 in gap 78. In this condition lines-of-force 80 may be described as essentially axially aligned with axis 77. This condition is achieved when a magnetic line-of-force 80E at the periphery of a substrate 40 is incident thereon at an angle 86 no greater than about forty degrees, measured in any orientation from a direction perpendicular to substrate 40. This provides that at all points on substrate 40 an axial component (indicated in FIG. 2 by arrow 88) of a magnetic line-of-force 80 is the majority component. For the magnetic field as a whole, any radial or transverse component (indicated by arrow 89) is essentially negligible.

It should be noted here that a magnet placed in or behind cathode 30 would not give rise to the above-described magnetic field form required in the present invention. Such a magnet placement may form, for example, a magnetron discharge ring around cathode 30 by interacting with electric field in the vicinity of cathode. Such a magnetron discharge ring is particularly undesirable in the method of the present invention.

Figure 3:
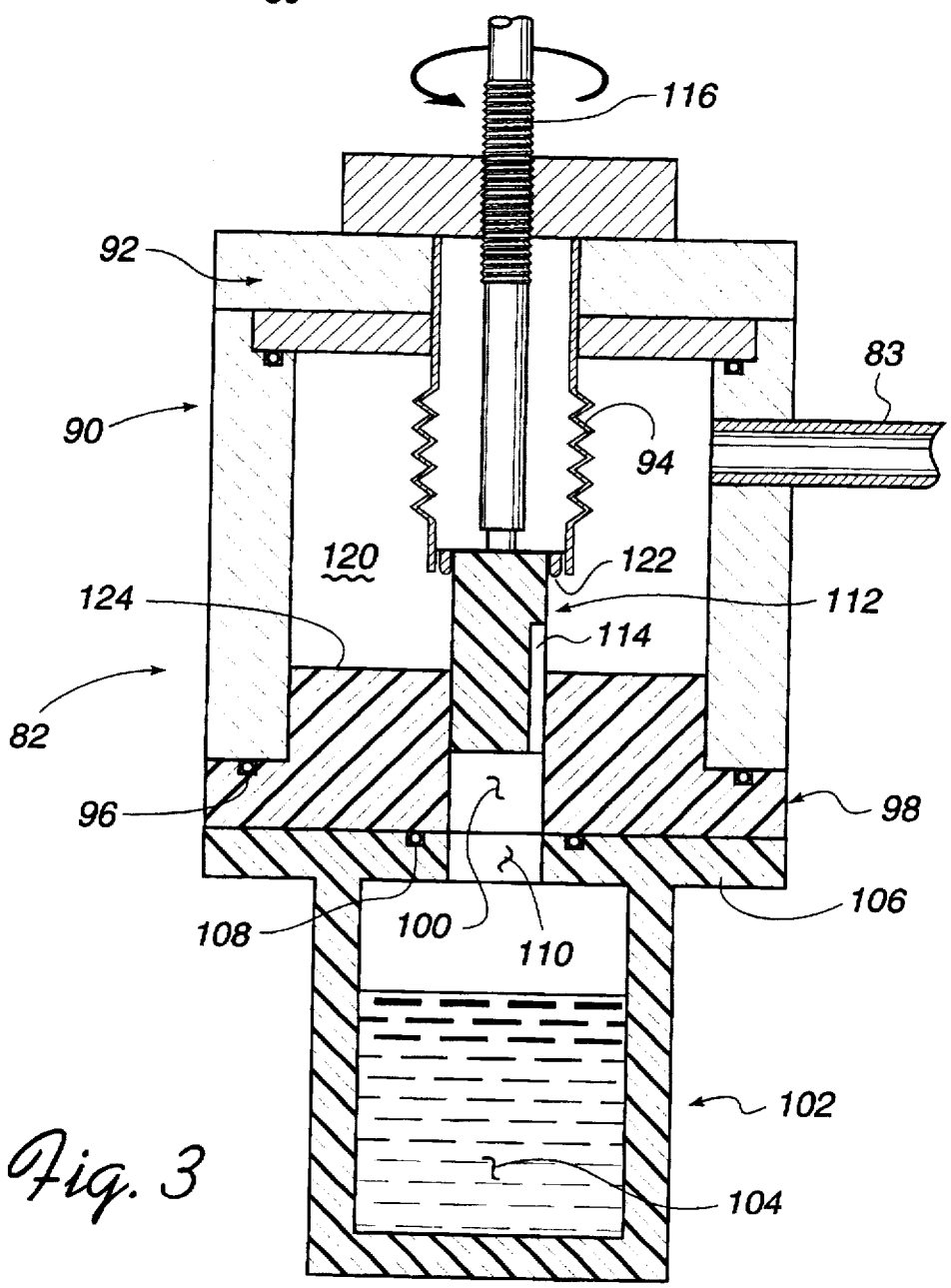
FIG. 3 is a general cross-section view schematically illustrating a bromine-gas delivery system for the apparatus of FIG. 1.

As noted above, a preferred etchant-gas for the RIE method of the present invention is bromine. Bromine is a particularly corrosive material both in liquid and gaseous form. Accordingly, for delivering bromine to chamber 22 it is preferable that etchant-gas delivery arrangement 82 (see FIG. 1) be configured to avoid significant corrosion by bromine. A brief description of one suitable bromine-gas delivery arrangement is set forth below with reference to FIG. 3.

Here, etchant-gas arrangement 82 includes a cylindrical, stainless steel valve-body 90. Valve body 90 is closed at one end thereof by a stainless steel plug 92 and stainless steel bellows 94. Inserted in an opposite end of valve body 90, and sealed thereto by a seal 96, is a plug 98 of inert plastic material such as a fluorcarbon polymer having cylindrical bore 100 therein. A bromine reservoir 102 (also of inert plastic) including liquid bromine 104 is sealed via a flange 106 thereof and a seal 108 to plug 98. An aperture 110 in flange 106 is aligned with bore 100 in plug 98.

An inert plastic metering-rod 112 is sealed to bellows 94 and extends in a slidable close fit into bore 100. Metering-rod 112 may be inserted into and withdrawn from bore 100 by means of a micrometer screw 116. A narrow slot 114 extends, longitudinally, partially along metering-rod 112. For a metering-rod having a diameter of about 6.0 mm diameter and a length of about 20 mm. Slot 114 preferably has a depth and width of only a few tens of micrometers, corresponding, by way of example, to dimensions of a slot scratched into the metering-rod using a razor-blade or the like.

When chamber 22 is under vacuum, and slot 114 is partially withdrawn from bore 100, liquid bromine 104 evaporates to form bromine-gas which flows into cavity 120 in valve body 90, then via conduit 83 to chamber 22 (see FIG. 1). When metering-rod 112 is inserted completely into bore 100, and seal 122 on the metering-rod seats against surface 124 of plug 98, bromine flow is cut off, and air cannot enter chamber 22 via conduit 83 if reservoir 102 is removed from plug 98. This reservoir arrangement permits that once bromine flow is cut off, cavity 120 can be exhausted preventing condensation of bromine-gas on bellows 94. This inhibits corrosion of the bellows by bromine.

In the description presented above, the etching method of the present invention and apparatus for carrying out the method of the invention have been described in primarily general terms. Set forth below, with reference to etching a pattern of slots in a silicon membrane, is a description of specific experiments performed to assist in determining operating parameters of the method and apparatus.

Referring again to FIG. 1, the experiments were performed in apparatus wherein chamber 22 was formed from stainless steel, cathode 30 was a disc-shaped aluminum cathode having an overall diameter of about 20.3 cm; anode (ground plate) 76 was an aluminum disc having a diameter of about 28.0 cm and a thickness of 3 mm; and magnet 70 was a ferrite disk having a diameter of about 28.0 cm and a thickness of about 1.27 cm. For preparing stencil mask samples, substrate 40 was a silicon membrane (see FIG. 2) having a thickness between about 0.75 and 2.5 µm and a diameter of about 14 cm. Mask layer 60 on membrane 40 was formed from silicon dioxide. Substrate (membrane) 40 and anode 72 and cathode 30 were spaced apart by about 8.25 cm. Magnetic field strength in the vicity of memberane 40 was about 50 Gauss.

Base vacuum of chamber 22 was less than $5 \times 10^{-6}$ mTorr. RF power was at a frequency of 13.56 MHz. Power ranged from about 20.0 to 140.0 Watts (w). Power dependent self-bias voltage of cathode 30 ranged from about 110 to 225 Volts (V).

Silicon etching was performed with a bromine-plasma, i.e., a plasma consisting essentially of pure bromine, and only insignificant quantities gaseous impurities. Nothing but commercially available (99.99) percent pure liquid bromine was placed in reservoir 102 of the above-described bromine delivery system of FIG. 3. Preferably etchant-gas in the etchant-gas plasma should contain no more than ten percent gaseous impurities and preferably less than one percent oxygen. Bromine pressure ranged from about 2.0 to 8.0 mTorr.

Silicon etch rates were determined from n-type Si wafers having a (100) orientation and a resistivity of about 7–15 ohm-centimeter (Ω-cm). Silicon dioxide layers for forming silicon-etching masks were deposited on the Si wafers by either chemical vapor deposition (CVD) and reactive DC-sputtering. To study anisotropy of Si etching, a 0.12 µm thick $SiO_2$ layer was reactively sputter-deposited on an n-type (100) Si wafer. A 0.25 µm thick layer of PMMA was then applied by spin-coating. The PMMA layer was patterned by electron beam lithography (EBL). Wall taper of features in both $SiO_2$ masks and Si samples were measured using a scanning electron microscope (SEM).

In order to obtain Si etch rates, partially masked samples were etched for known times and the etch depth was determined by a stylus-type surface profiler. Removal of a thin, native-oxide layer on any given silicon sample was accomplished pre-etching the sample by a relatively short exposure (of about 120 seconds duration), to a fluoroform ($CHF_3$) plasma. Si etch rate was corrected accordingly.

Silicon dioxide etch rates were determined by etching sample $SiO_2$ layers for known times and measuring layer thickness before and after etching. Thickness of the layers was determined by ellipsometry. No difference in the etch rates of CVD deposited and sputter-deposited silicon dioxide films was observed.

In order to ensure that etch features in a silicon membrane were of the highest possible quality, it was deemed important that a silicon dioxide mask layer on the membrane should also be of the highest possible quality. Accordingly, apertures 62 in silicon dioxide mask layer 60 (see FIG. 2) were etched in apparatus 20.

Silicon dioxide mask layers described in the prior art have been etched (patterned) in halocarbon gas discharges. In the above-cited Wolfe et al. patent it is taught that bromotrifluoromethane ($CF_3Br$) was a preferred etchant-gas for patterning silicon dioxide mask-layers.

In apparatus 20 configured as described above, however, it was not possible to determine any set of conditions under which acceptable $SiO_2$/PMMA selectivity could be obtained. It was determined that even under maximum selectivity conditions (a maximum selectivity of about 0.4), a 0.6 µm thick PMMA layer would be required to pattern a 0.1 µm thick silicon oxide layer. It is generally believed that high quality sub-0.1 µm wide features cannot be fabricated in PMMA films thicker than approximately 0.3 µm. In view of this disadvantage of CF3Br etching of silicon dioxide, $CHF_3$ was investigated as an alternative etching gas. The results of this investigation are depicted in FIG. 4 and FIG. 5.

Figure 4:
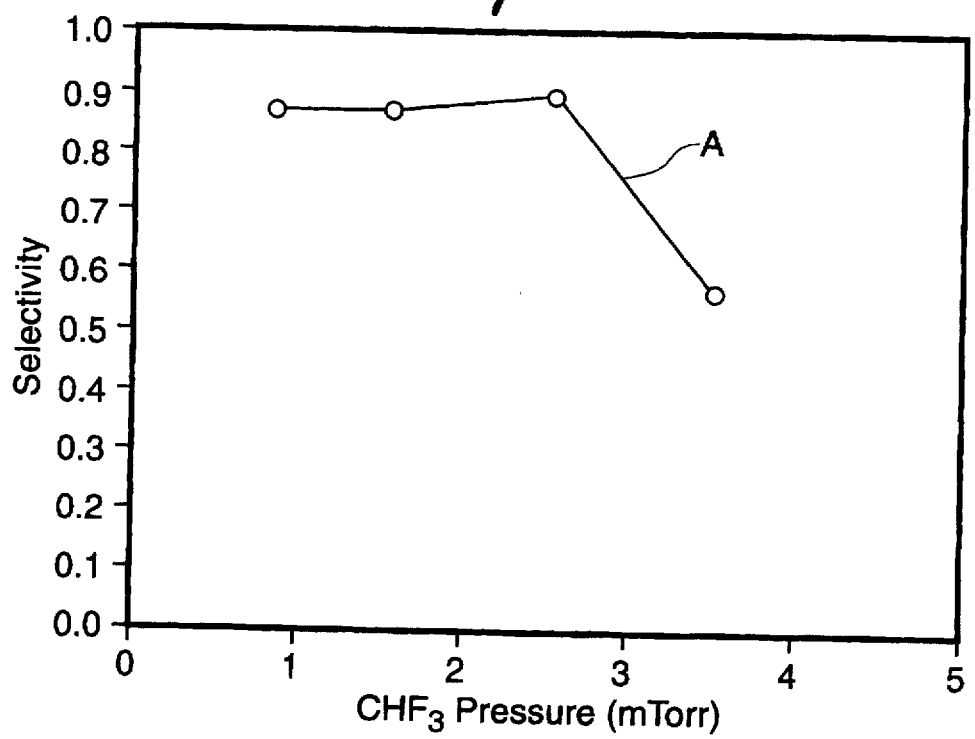
FIG. 4 is a graph schematically illustrating etch selectivity of silicon dioxide relative to polymethyl methacrylate as a function of plasma pressure in a fluoroform ($CHF_3$) plasma in the apparatus of FIG. 1.
Figure 5:
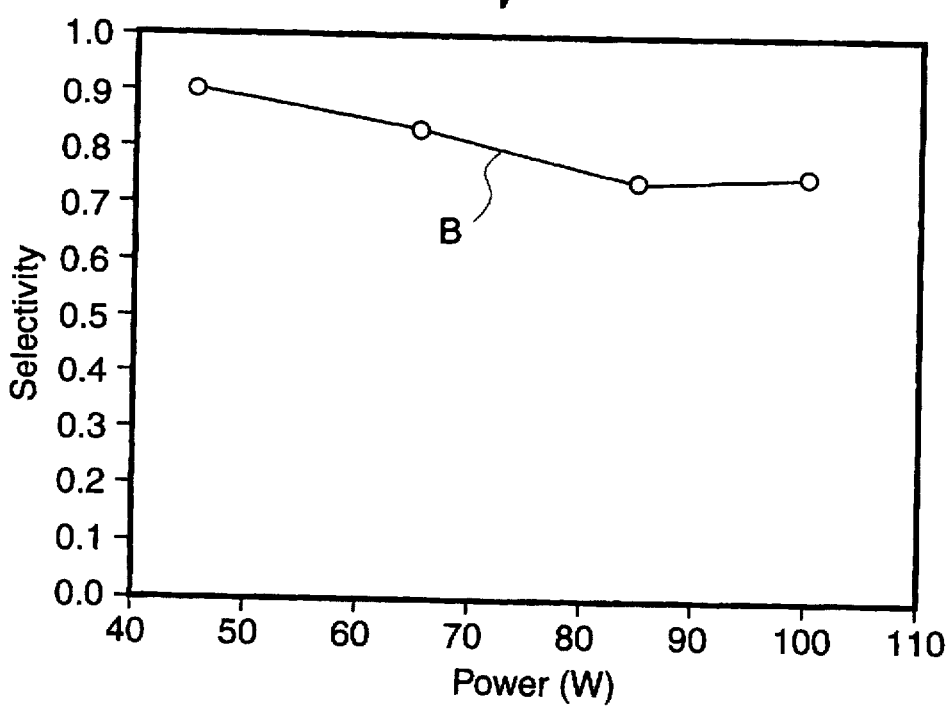
FIG. 5 is a graph schematically illustrating etch selectivity of silicon dioxide relative to polymethyl methacrylate as a function of RF power in a fluoroform plasma in the apparatus of FIG. 1.

In FIG. 4, curve A shows $SiO_2$/PMMA selectivity as a function of $CHF_3$ etchant-gas plasma pressure for a constant 45 W RF power. Curve A indicates that, a maximum selectivity of 0.9/1.0 can be achieved. This represents better than a twofold improvement over maximum selectivity obtainable using a $CF_3Br$ etchant-gas in the same apparatus. In FIG. 5, curve B shows $SiO_2$/PFLMA selectivity as a function of RF power for a 2.5 mTorr $CHF_3$ plasma pressure. Curve B shows that RF power does not have a significant effect on $SiO_2$/PMMA selectivity. Because of these advantageous results, in all examples described hereinafter, $SiO_2$ layers were patterned by a $CHF_3$ plasma operating at 0.8 mTorr pressure and 45 W RF power. The $SiO_2$ etch rate at these conditions was approximately 26.0 nanometers per minute (nm/min).

In order for an $SiO_2$ layer to be useful as a masking layer for etching a silicon membrane to form a high quality stencil mask, it is believed that an $Si/SiO_2$ etch selectivity greater than about 25.0 is desirable, preferably about 50.0. Further, in order to minimize distortion during use, silicon stencil masks typically have a very low intrinsic stress, for example, about 10.0 Mega Pascal (MPa) in a membrane having a thickness between about 1.0 and 2.0 µm. A tensile (as opposed to compressive) stress is preferred to prevent the stencil masks from wrinkling. Such a low membrane stress poses severe restrictions on the thickness of a silicon dioxide layer that can be deposited on such a membrane. This is because any deposited layer, whose thickness is comparable to that of the membrane, can drastically alter the original membrane stress (say from tensile to compressive).

Figure 6:
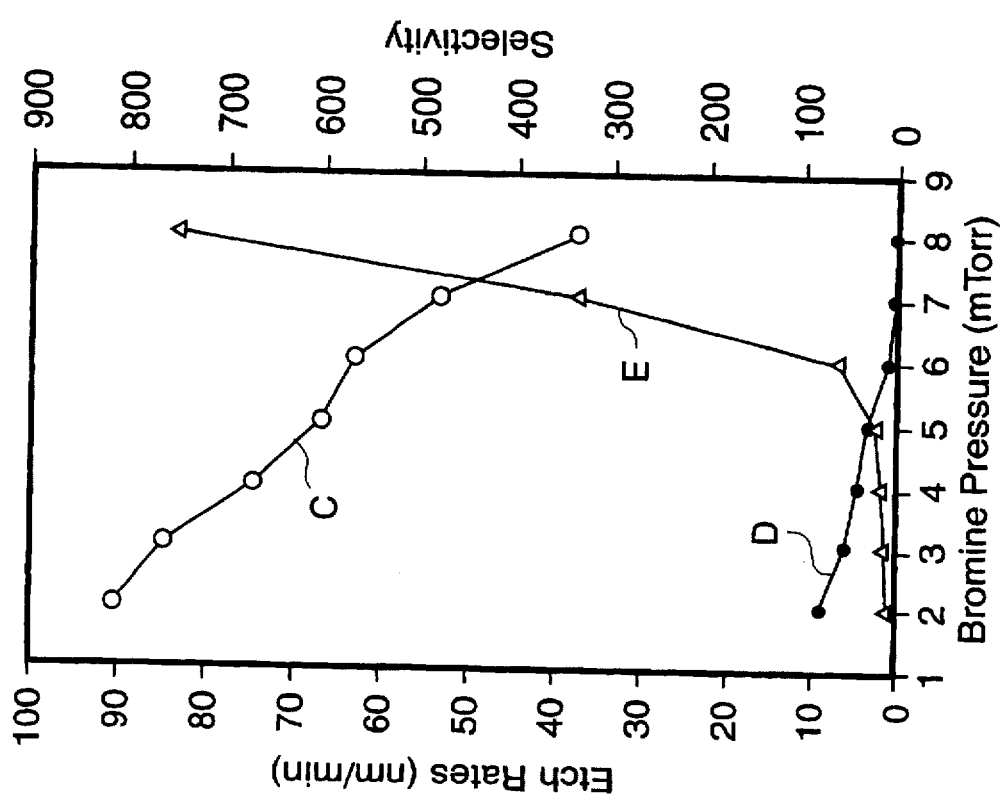
FIG. 6 is a graph schematically illustrating etch rate for silicon and silicon dioxide and etch selectivity of silicon relative to silicon dioxide ($Si/SiO_2$ selectivity) as a function of bromine-plasma pressure in the apparatus of FIG. 1.

Referring now to FIG. 6, Curves C, D, and E show Si and $SiO_2$ etch rates and $Si/SiO_2$ selectivity as a function of bromine-plasma pressure for a constant (about 85.0 W) RF power. It would generally be expected from prior art teachings that an increase in gas pressure should result in an increase in reactant (bromine ion) density due to a higher probability of electron-neutral collisions. An etching process dominated by chemical reaction between bromine ions and silicon would consequently exhibit an increased etch rate. In FIG. 6, however, as the Br pressure is increased from 2 mTorr to 8 mTorr, the Si etch rate shows a monotonous decrease from 91 nm/min. to 37 nm/min. Hence, it can be deduced that, in the etching method of the present invention, chemical reactions are not a rate controlling step when etching silicon in a bromine-plasma.

DC self-bias voltage on the cathode 30 actually increases by 4 V when bromine pressure is varied from 2 mTorr to 8 mTorr. SiO₂ etch rate also decreases with increasing pressure. As an increase in self-bias potential would be expected from prior art teachings to increase etch rate, self-bias voltage change cannot explain the significant drop in etch rate with increasing pressure indicated by curve C.

It is believed, without being limited to a particular theory, that, in the method of the present invention, etch rate of Si and SiO₂ in bromine-plasmas is determined to a large extent by ion bombardment energy, which is determined not only by self-bias voltage, but also by factors such as plasma potential and ion-neutral collision probability in the plasma sheath. An increase in pressure appears to reduce the plasma potential while increasing the probability of ion-neutral collisions in the sheath. Both factors contribute to a lower ion bombardment energy with increasing pressure.

Since the SiO₂ etch rate is a much stronger function of pressure than the Si etch rate, the Si/SiO₂ selectivity increases from 10 at 2 mTorr to 750 at 8 mTorr. At an 85 W RF power, an operating pressure range of 5.5 mTorr to 7 mTorr (selectivity between about 25 and 100) was found preferable because operating at higher selectivities are known to cause surface micro-roughness and consequent etch quality degradation.

Figure 7:
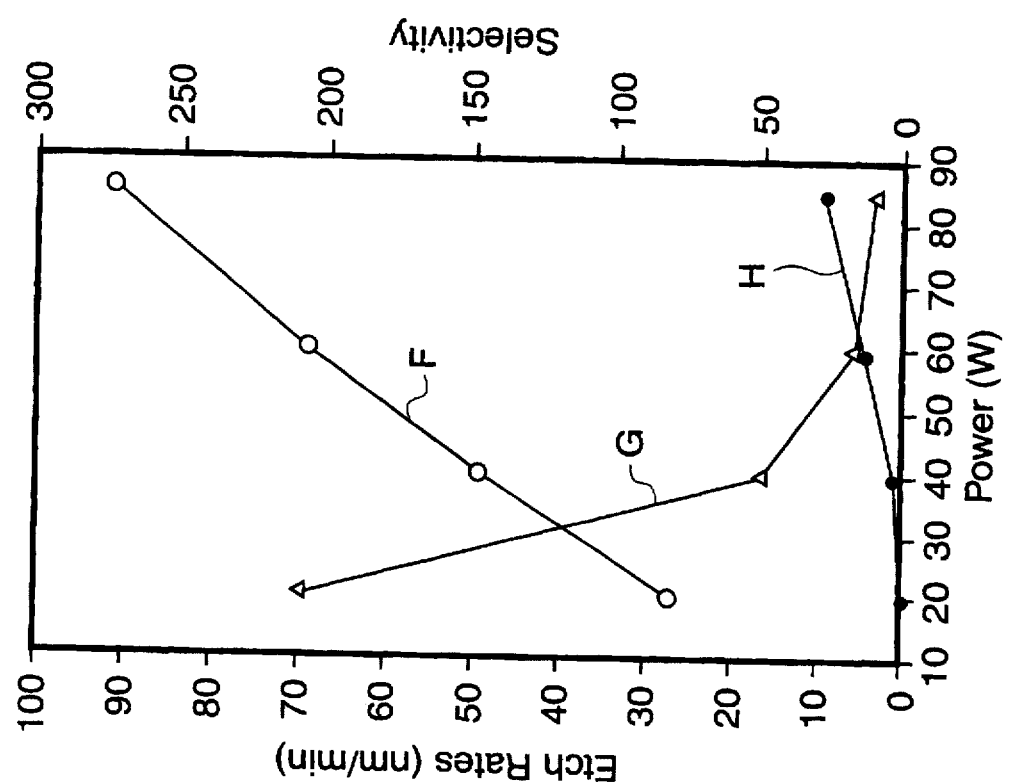
FIG. 7 is a graph schematically illustrating etch rates for silicon and silicon dioxide and etch selectivity of silicon relative to silicon dioxide as a function of RF power in a two milliTorr bromine-plasma in the apparatus of FIG. 1.

Referring now to FIG. 7, curves F, G and H show respectively Si and SiO₂ etch rates and etch selectivity as a function of RF power at a constant bromine-plasma pressure of about 2.0 mTorr. An increased reactant (Br ion) concentration and a higher self-bias potential would, based on prior art teachings, be anticipated when input RF power is raised without altering the pressure. Both these factors would be expected to contribute to an enhancement of etch rate. Based on the previous discussion (etch rate variation with pressure) however, the increase in Si etch rate from 27.0 nm/min. at 20.0 W to 91.0 nm/min. at 85.0 W can be mainly attributed to an increased self-bias voltage.

Figure 8:
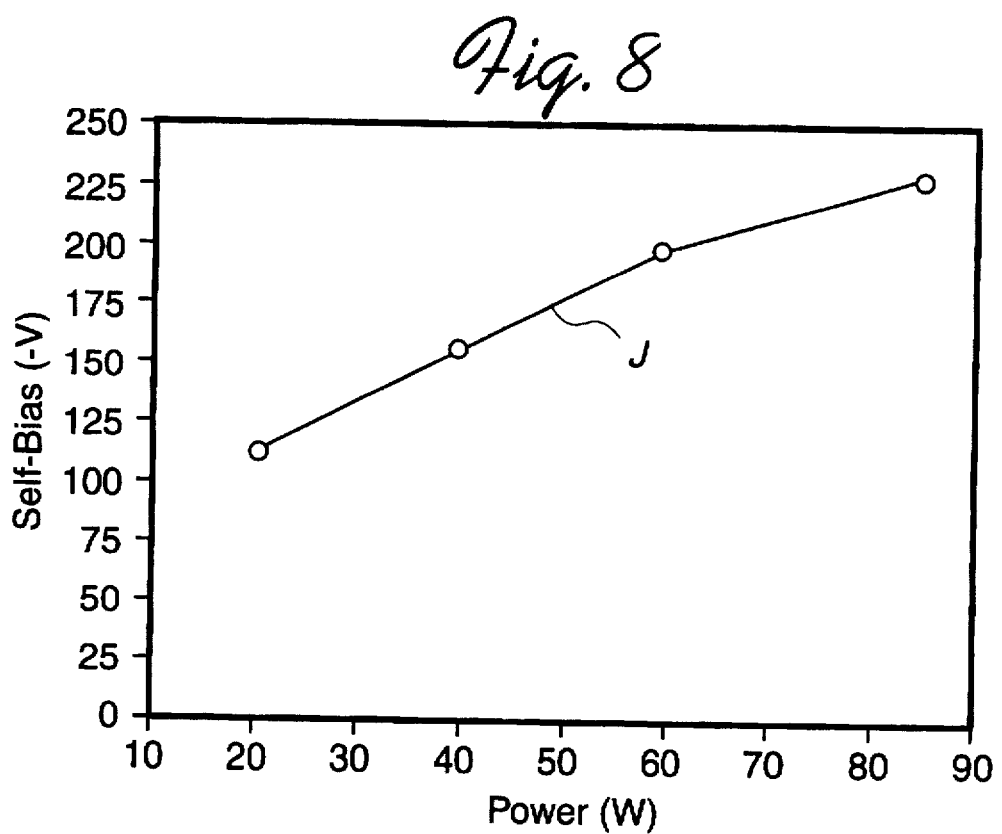
FIG. 8 is a graph schematically illustrating cathode self-bias versus RF power in a two milliTorr bromine-plasma in the apparatus of FIG. 1.

In FIG. 8, curve J depicts change in self-bias voltage (of cathode 30) as a function of RF power for a constant, 2.0 mTorr bromine-plasma pressure. As indicated in FIG. 7, the SiO₂ etch rate increases much more rapidly than the Si etch rate resulting in a degradation of the Si/SiO₂ selectivity with increasing power. A selectivity of about 50.0 can be obtained at about 40.0 W RF power.

In FIG. 9, curves K, L, and M show respectively Si and SiO₂ etch rates and selectivity as a function of RF power at a constant 8.0 mTorr bromine-plasma pressure. Etch rate dependence on RF power is similar at 8.0 mTorr bromine-plasma pressure to the dependence at 2.0 mTorr bromine-plasma pressure (see FIG. 7). In FIG. 9, RF power varied from 85.0 W to 140.0 W, and a selectivity of about 50.0 is indicated for a power of about 120.0 W.

Together, FIGS. 7 and 9 indicate that for a specific Si/SiO₂ selectivity, a wide range of parameter sets are available. This possibility is confirmed in FIG. 10, wherein curves O and P depict respectively Si etch rate and bromine-plasma pressure as a function of RF power for a constant Si/SiO₂ selectivity of approx. 50. As noted above selectivity increases with increasing bromine pressure but decreases with increasing power. Thus, to keep a constant selectivity, an increase in the input power should be accompanied by an increase in the pressure. This is specifically what is depicted in FIG. 10. It is also evident from FIG. 10 that a 400% increase in power results only in a modest 50% increase in the Si etch rate, if the selectivity is to be preserved. Given the wide choice of parameter sets available for a given (high) selectivity and low etch rate variation. Choice of operating conditions for the method and apparatus of the present invention are ultimately selected based on the quality of structures, i.e., the wall taper, and width of etch features, obtained with given parameter sets.

In this regard, silicon stencil masks were patterned (using SiO₂-layer masks), according to the method of the present invention under conditions representing each of the data points (triangles indicating power as a function of bromine pressure) of FIG. 10. These were about 25.0 W at about 0.5 mTorr; about 40.0 W at about 2.0 mTorr, about 55.0 W at about 4.0 mTorr, about 85.0 W at about 6.0 mTorr), and about 120.0 W, at about 8.0 mTorr. Highest quality structures are obtained at about 85.0 W and about 6.0 mTorr and about 120.0 W at about 8.0 mTorr. These conditions have been successfully used to fabricate numerous slit patterns in silicon membranes between about 0.75 and 2.5 μm in thickness, including slits having a minimum width of 0.04 μm and a wall taper less than 0.2 degrees.

In summary a magnetically-enhanced, RF diode, reactive etching method and apparatus has been described above. The method and apparatus have been found particularly attractive for etching PMMA-masked silicon dioxide layers in a CHF₃-plasma and for etching SiO₂-masked silicon layers or membranes in a bromine-plasma.

Apparatus of in accordance with the present invention is relatively simple to construct and maintain. Several interrelationships of operating parameters of the apparatus are different from, and would not be expected from teachings of the prior art. These interrelationships, nevertheless, provide that the apparatus can be operated, flexibly and non-critically, under a relatively wide variety of operating parameters compared with prior art apparatus. This flexibility of operation is achieved while still providing etch features which are believed to be of a quality certainly equal to, and probably superior to comparable features produced by prior art apparatus.

The apparatus of the present invention has been described with reference to a preferred and other embodiments. The invention, however, is not limited to those embodiments described and depicted. Rather, the invention is limited only be the claims appended hereto.

What is claimed is:

1. A method for etching a pattern in a silicon layer, said silicon layer being coated on a selective surface thereof with a silicon dioxide mask, said mask having a plurality of apertures extending therethrough, the apertures corresponding to the pattern to be etched, the method comprising the steps of:

(a) providing an anode electrode and a cathode electrode, said electrodes facing each other, spaced apart and defining a gap therebetween;

(b) locating the mask-coated silicon layer to be etched in said gap, in thermal contact with said cathode electrode, and with the mask-coated surface of the silicon layer facing said anode electrode;

(c) providing a magnetic field in said gap, said magnetic field characterized by magnetic lines-of-force extending continuously through said gap from said anode electrode to the selected surface of layer of material at all points on said selected surface, and said magnetic lines of force incident on said selected surface at an angle of less than forty degrees, said incident angle measured in any orientation from a direction perpendicular to said selected surface;

(d) admitting bromine-gas into said gap at a pressure between about 2.0 and 15.0 milliTorr;

(e) applying RF electrical power to said anode and cathode electrodes, thereby generating a bromine-plasma in said gap;

(f) cooling said cathode electrode; and (g) etching the silicon layer by means of bromine ions attracted from said bromine-plasma toward said cathode electrode.

* * * * *